(12) United States Patent
Kusunoki

(10) Patent No.: US 7,772,605 B2
(45) Date of Patent: Aug. 10, 2010

(54) COMPOUND SEMICONDUCTOR LIGHT-EMITTING DEVICE

(75) Inventor: Katsuki Kusunoki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 206 days.

(21) Appl. No.: 10/591,076

(22) PCT Filed: Mar. 17, 2005

(86) PCT No.: PCT/JP2005/005439

§ 371 (c)(1),
(2), (4) Date: Aug. 30, 2006

(87) PCT Pub. No.: WO2005/091389

PCT Pub. Date: Sep. 29, 2005

(65) Prior Publication Data

US 2007/0176181 A1 Aug. 2, 2007

Related U.S. Application Data

(60) Provisional application No. 60/560,269, filed on Apr. 8, 2004.

(30) Foreign Application Priority Data

Mar. 19, 2004 (JP) ............................. 2004-081286

(51) Int. Cl.
*H01L 33/00* (2010.01)
(52) U.S. Cl. ..................... 257/98; 257/94; 257/E33.067
(58) Field of Classification Search ................... 257/88, 257/94, 98, E33.067; 313/506

See application file for complete search history.

(56) References Cited

U.S. PATENT DOCUMENTS 4,843,280 A * 6/1989 Lumbard et al. ............ 313/500

(Continued)

FOREIGN PATENT DOCUMENTS

EP 1 376 687 A2 1/2004

(Continued)

*Primary Examiner*—Shouxiang Hu
(74) *Attorney, Agent, or Firm*—Sughrue Mion, PLLC

(57) ABSTRACT

An object of the present invention is to provide a compound semiconductor light-emitting device having side surfaces of large surface area to improve the efficiency for outwardly transmitting the emitted light. Another object of the present invention is to provide a technology capable of easily forming the side surfaces with large surface area without using a cutting tool and without the need of taking a trouble to impart mechanical damage.

The inventive compound semiconductor light-emitting device has a light-emitting layer, on a substrate, wherein at least a part of a substrate portion of the device side surface has recessed portions in a side direction of the device. The inventive method of producing compound semiconductor light-emitting device comprises the steps of: (a) forming a compound semiconductor layer including a light-emitting layer of an n-type or p-type compound semiconductor on a wafer that serves as a substrate, (b) arranging a negative electrode and a positive electrode at predetermined positions for passing a drive current through the light-emitting layer, (c) forming a separation zone for separating the individual light-emitting devices, (d) perforating many small holes linearly in the wafer that serves as the substrate along the separation zone, and (e) dividing the wafer into individual light-emitting devices along the separation zone.

7 Claims, 2 Drawing Sheets

U.S. PATENT DOCUMENTS

| | | | |
|---|---|---|---|
| 5,040,044 A * | 8/1991 | Noguchi et al. | 257/103 |
| 6,531,405 B1 * | 3/2003 | Wegleiter et al. | 438/745 |
| 6,614,172 B2 * | 9/2003 | Chiu et al. | 313/501 |
| 6,700,139 B2 * | 3/2004 | Suzuki et al. | 257/103 |
| 6,809,340 B2 * | 10/2004 | Kato et al. | 257/79 |
| 6,924,513 B2 * | 8/2005 | Akaike et al. | 257/98 |

FOREIGN PATENT DOCUMENTS

| | | | |
|---|---|---|---|
| JP | 4-116848 A | 4/1992 | |
| JP | 7-273069 A | 10/1995 | |
| JP | 9-92878 A | 4/1997 | |
| JP | 2002-205180 A | 7/2002 | |
| JP | 2003-151921 A | 5/2003 | |
| JP | 2003-298107 A | 10/2003 | |
| JP | 2003-338468 A | 11/2003 | |

* cited by examiner

NEGATIVE ELECTRODE (Ti/Au)
POSITIVE ELECTRODE (Au)
POSITIVE ELECTRODE (Pt/Rh)

DISTANCE BETWEEN RECESSED PORTIONS
DEPTH OF RECESSED PORTION
WIDTH OF RECESSED PORTION

COMPOUND SEMICONDUCTOR LIGHT-EMITTING DEVICE

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/560,269 filed on Apr. 8, 2004, pursuant to 35 U.S.C. §111(b).

TECHNICAL FIELD

The present invention relates to a compound semiconductor light-emitting device and to a method of producing the same. More specifically, the invention relates to a compound semiconductor light-emitting device having side surfaces of improved efficiency for transmitting light to the outside.

BACKGROUND ART

A pn junction type light-emitting diode (LED) has heretofore been known as a compound semiconductor light-emitting device (see, for example, "General Theory of Semiconductor Devices" by Iwao Teramoto, First Edition, Baifukan Publishing Co., Mar. 30, 1995, Chapter 7). For example, there has been known a GaP LED utilizing, as a light-emitting layer, a GaP layer obtained by epitaxially growing a single crystal of electrically conducting gallium phosphide (GaP) on a substrate (see the above "General Theory of Semiconductor Devices" by Iwao Teramoto, First Edition, Baifukan Publishing Co., Mar. 30, 1995, Chapter 7). There have further been known red band and orange yellowish to green band LEDs using a gallium aluminum arsenide mixed crystal ($Al_XGa_Y$As: $0 \leq X, Y \leq 1$ and $X+Y=1$) and a gallium indium aluminum phosphide mixed crystal ($Al_XGa_YIn_ZP$: $0 \leq X, Y, Z \leq 1$ and $X+Y+Z=1$) as a light-emitting layers (see the above "General Theory of Semiconductor Devices" by Iwao Teramoto, First Edition, Baifukan Publishing Co., Mar. 30, 1995, Chapter 7). There has further been known a near ultraviolet band, blue band or green band short-wavelength LED using, as a light-emitting layer, a III-Group nitride semiconductor layer such as indium gallium nitride ($Ga_\alpha In_\beta N$: $0 \leq \alpha, \beta \leq 1$, $\alpha+\beta=1$) (see, for example, Japanese Examined Patent Publication (Kokoku) No. 55-3834).

In the above $Al_XGa_YIn_ZP$ LED, a single crystal of electrically conducting p-type or n-type gallium arsenide (GaAs) is used as a substrate, and an electrically conducting n-type or p-type light-emitting layer is formed thereon. In the blue LED, a single crystal of electrically insulating sapphire ($\alpha$-$Al_2O_3$ single crystal) is used as a substrate (see the above Japanese Examined Patent Publication (Kokoku) No. 55-3834). The short-wavelength LED further utilizes a cubic (3C crystalline) or hexagonal (4H or 6H crystalline) silicon carbide (SiC) as a substrate.

Usually, the following method is used to separate a wafer forming a plurality of semiconductor multilayer structure having light-emitting layer etc. on the wafer into the individual compound semiconductor light-emitting devices. (1) First, a semiconductor multilayer structure for LED is formed by forming an epitaxially grown layer that is necessary for constituting the LED on the surface of the wafer that serves as the substrate. (2) Next, negative electrodes and positive electrodes are arranged. (3) At the same time, linear stripe-like recessed grooves called separation zones are formed on the side of the front surface where the devices are formed, so as to be utilized for separation into individual devices, and scribe lines or cutting lines are formed along the separation zones. The cutting lines may be formed prior to forming the negative electrodes and the positive electrodes. At a moment when the scribe lines or the cutting lines are provided, however, the compound semiconductor light-emitting devices are still on the surface of the wafer that becomes the substrates and are arranged regularly and continuously. (4) To cut the wafer into individual devices, a cutting tool such as a diamond grinding blade that is revolving is moved linearly and horizontally in the recessed groove in the separation zone to cut and remove the substance forming the region where the wafer is to be divided. (5) Next, a mechanical pressure is applied from an external side onto the recessed groove that is further deepened due to the cutting. The wafer is cut by utilizing the mechanically weakened deep grooves and is divided into individual devices. According to another method, the wafer is divided into individual devices by utilizing the cleaving property of the substrate crystals or of the epitaxially grown layer by imparting continuous or intermittent mechanical shock to the scribe lines instead of effecting the cutting to deepen the recessed grooves. In dividing the wafer into individual devices by utilizing the cleaving property, it is a widely accepted practice to form from the scribe lines in a direction in which the substrate crystal or the grown layer cleaves, e.g., in parallel with the <110> direction in the case of zincblende crystals such as GaAs having a strong ionic bond.

A technology for increasing the surface areas of the side surfaces of an LED having, as side surfaces, cut surfaces or cleaved surfaces exposed along the scribe lines, is advantageous for increasing the efficiency for outwardly transmitting the emitted light. If this technology is utilized for a compound semiconductor light-emitting device that features excellent efficiency for outwardly transmitting the emitted light, it is allowed to constitute a lamp featuring a higher brightness yet consuming the same amount of electric power. In a nearly square LED having a side of a length of 200 μm to 450 μm, however, the separation zone in which the cutting line or the scribe line is provided has a width (transverse width) of, usually, from 20 μm to 50 μm at the greatest. The separation zone forms a region that does not contribute to emitting light. If this region is wide, the region that contributes to forming the light-emitting device decreases on the substrate wafer and the cost of production increases.

As described above, the width (transverse width) of the separation zone is as narrow as the blade tip of the cutting tool. Therefore, the blade tip of the cutting tool is not allowed to move in a line shifted longitudinally and transversely. If forcibly moved longitudinally and transversely, the blade tip of the cutting tool deviates from the recessed groove of the line and it becomes probable that the light-emitting layer and the electrode are cut or damaged causing the devices to become defective. It is therefore difficult to obtain side surfaces of large surface areas having a zig-zag plane in cross section.

The same also holds even when the wafer is divided into individual devices relying upon the cleavage by the scribing method. For example, to form side surfaces having large surface areas, the mechanical damage for triggering the cleavage must be imparted in an undulating manner or a zig-zag manner. Despite the mechanical damage being imparted in an undulating manner, however, there still remains the inconvenience that the wafer is linearly divided in the cleaving direction naturally in compliance with the cleaving property without following the direction of imparting the damage. Namely, according to the prior art, the resultant side surfaces are nearly planes irrespective of whether cutting or cleavage is used. In particular, the side surfaces obtained by the cleaving method are flat surfaces having smoothness favorable for being utilized as laser beam resonance surfaces. Therefore, it is difficult to produce an LED, having side surfaces of large surface area, which improves the efficiency for outwardly transmitting the emitted light.

In Japanese Laid-Open Patent Application (kokai) No. 2003-110136, which increases the efficiency for outwardly transmitting the emitted light by means of making the device side surface rugged, the undulating ruggedness is formed in the side surface of compound semiconductor layers formed on the sapphire substrate by etching. However, because the compound semiconductor layers formed on the sapphire substrate is very thin, the resultant increased amount of surface area is very small.

DISCLOSURE OF INVENTION

It is therefore an object of the present invention to provide a compound semiconductor light-emitting device having side surfaces of large surface area to improve the efficiency for outwardly transmitting the emitted light, a lamp using the same and a source of light using the lamp. Another object of the present invention is to provide a technology capable of easily forming the side surfaces with large surface area without using a cutting tool and without the need of taking a trouble to impart mechanical damage.

According to the present invention, there are provided:

(1) A compound semiconductor light-emitting device having a light-emitting layer on a substrate, wherein at least a part of a substrate portion of the device side surface has recessed portions in a side direction of the device.

(2) A light-emitting device according to above (1), wherein at least a part of a compound semiconductor portion of the device side surface has recessed portions in a side direction of the device.

(3) A light-emitting device according to above (1) or (2), wherein the light-emitting layer comprises an n-type or p-type compound semiconductor and is of the pn junction type.

(4) A light-emitting device according to any one of above (1) to (3), wherein the substrate is selected from the group consisting of a sapphire, a SiC and a III-V Group compound semiconductor single crystal.

(5) A light-emitting device according to any one of above (1) to (4), wherein recessed portions are existing maintaining a distance of 4 to 40 µm.

(6) A light-emitting device according to any one of above (1) to (5), wherein the recessed portions have a depth of 0.5 to 10 µm and a width of 1 to 20 µm.

(7) A light-emitting device according to any one of above (1) to (6), wherein the compound semiconductor light-emitting device is of the flip-chip type.

(8) A method of producing compound semiconductor light-emitting device comprising the steps of:

(a) forming a compound semiconductor layer including a light-emitting layer of an n-type or p-type compound semiconductor on a wafer that serves as a substrate, (b) arranging a negative electrode and a positive electrode at predetermined positions for passing a drive current through the light-emitting layer, (c) forming a separation zone for separating the individual light-emitting devices, (d) perforating many small holes linearly in the wafer that serves as the substrate along the separation zone, and (e) dividing the wafer into individual light-emitting devices along the separation zone.

(9) A method of production according to above (8), wherein the small holes are formed by a laser method.

(10) A method of production according to above (8) or (9), wherein the opening diameter of the small holes is 1 to 20 µm.

(11) A method of production according to any one of above (8) to (10), wherein the depth of the small holes is $1/10$ to $3/4$ of the thickness of the substrate.

(12) A method of production according to any one of above (8) to (11), wherein the distance between the small holes is 4 to 40 µm.

(13) A method of production according to any one of above (8) to (12), wherein the small holes are perforated from the side of the compound semiconductor layer formed on the front surface of the substrate.

(14) A method of production according to any one of above (8) to (13), wherein the small holes are perforated from the back surface of the substrate.

(15) A method of production according to above (14), wherein the depth of the small holes in the back surface of the substrate is deeper than that of the small holes in the front surface of the substrate.

(16) A method of production according to any one of above (8) to (15), wherein the small holes are periodically perforated.

(17) A method of producing compound semiconductor light-emitting device comprising the steps of:

(a) forming a compound semiconductor layer including a light-emitting layer of an n-type or p-type compound semiconductor on a wafer that serves as a substrate, (b) arranging a negative electrode and a positive electrode at predetermined positions for flowing a drive current to the light-emitting layer, (c) forming a separation zone for separation into the individual light-emitting devices, (d) projecting intermittently a laser beam setting a focal position in the wafer serving as the substrates to linearly scan along the separation zone, and (e) dividing the wafer into individual light-emitting devices along the separation zone.

(18) A lamp comprising a compound semiconductor light-emitting device of any one of above (1) to (7).

(19) A source of light comprising a lamp described above (18).

The substrate is perforated with small holes along the separation zones for division, so that the side surfaces of the light-emitting devices assume a rugged shape to possess increased surface areas to exhibit improved efficiency for outwardly transmitting the emitted light. Further, the heat-emitting regions decrease as compared to those obtained by utilizing the conventional cutting lines or the scribe lines, and the affected layer decreases in the compound semiconductor.

BEST MODE FOR CARRYING OUT THE INVENTION

Figure 1:
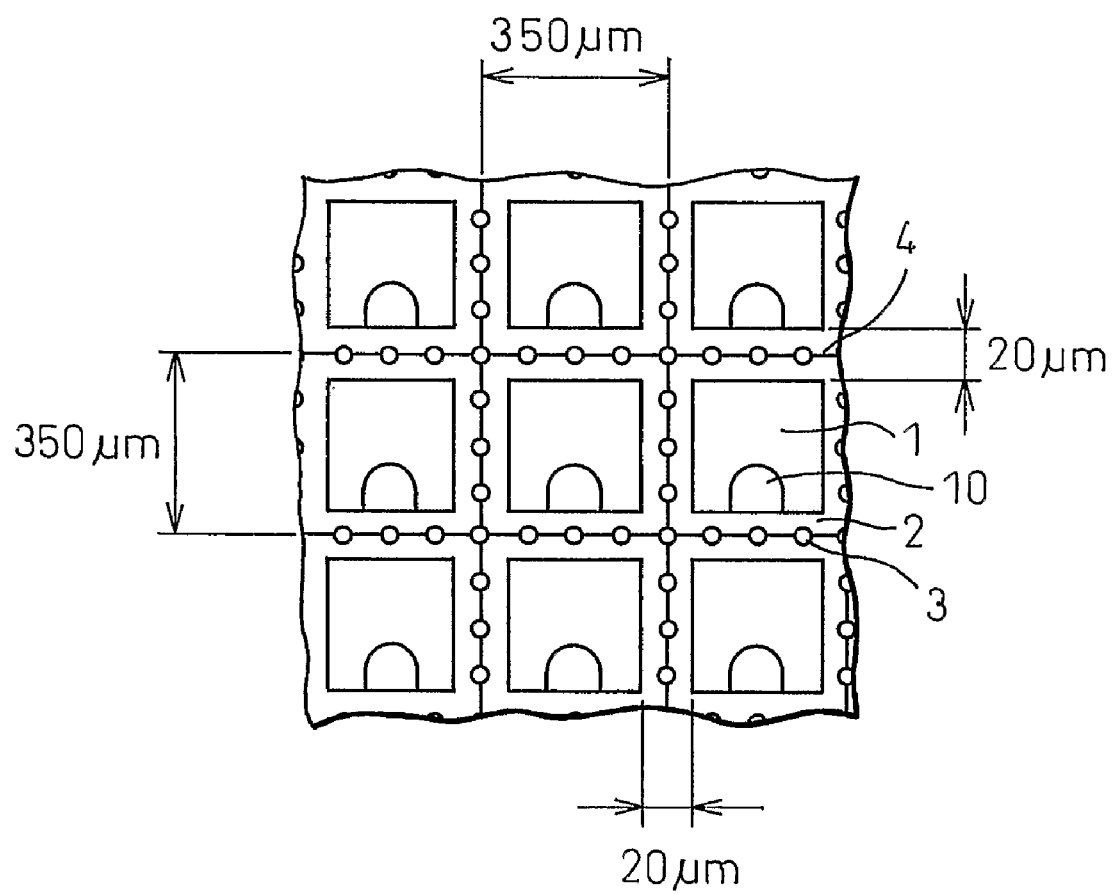
FIG. 1 is a diagram schematically illustrating a plane of a wafer for producing compound semiconductor light-emitting device of the present invention.

As the substrate material for forming a semiconductor multilayer structure of the present invention, there can be used a single crystal oxide material such as sapphire (α-Al$_2$O$_3$ single crystal), zinc oxide (ZnO) or lithium gallium oxide (composition formula, LiGaO$_2$). The above single crystal material of oxide which is optically transparent can be effectively used as a substrate for a flip-chip LED. There can be further used a single crystal of a IV-Group semiconductor such as a single crystal of silicon (Si) or a cubic or hexagonal silicon carbide (SiC), a single crystal of a III-V Group compound semiconductor such as gallium phosphide (GaP) and gallium nitride (GaN), or a single crystal of a II-VI Group compound semiconductor such as zinc sulfide (ZnS) or zinc selenide (ZnSe).

A compound semiconductor layer constituting a semiconductor multilayer structure can be represented by, for example, a layer of III-Group nitride semiconductor such as Al$_X$Ga$_Y$In$_Z$N$_{1-a}$M$_a$ ($0 \leq X \leq 1$, $0 \leq Y \leq 1$, $0 \leq Z \leq 1$, and $X+Y+Z=1$, wherein M is an element of the V Group different from nitrogen, and $0 \leq a < 1$). There can be further exemplified an Al$_X$Ga$_Y$As ($0 \leq X, Y \leq 1$, $X+Y=1$) layer and an Al$_X$Ga$_Y$In$_Z$P ($0 \leq X, Y, Z \leq 1$, $X+Y+Z=1$) layer formed on a substrate of gallium arsenide (GaAs) single crystal. There can be further exemplified a GaP layer formed on a GaP substrate. These compound semiconductor layers must be arranged on a suitable place on the substrate depending upon a desired function. To constitute a light-emitting portion of a double hetero junction structure, for example, compound semiconductor layers of the n-type and p-type are arranged on both the upper and lower surfaces of the light-emitting layer.

There is no particular limitation on the method of growing the compound semiconductor and any method can be employed, that has been known to grow a compound semiconductor, such as MOCVD (organometal chemical vapor phase growing method), HVPE (halide vapor phase growing method) or MBE (molecular beam epitaxial method). A preferred growing method is the MOCVD method from the standpoint of controlling the film thickness and mass productivity.

The device side surfaces referred to in the invention are the side surfaces of the substrate and the side surfaces of the epitaxially grown layers formed on the substrate to constitute an LED, such as the side surfaces of the light-emitting layer. The LED having a triangular shape on a plane has three side surfaces. The LED having a square shape or a rectangular shape on a plane has four side surfaces. The LED having a hexagonal shape on a plane has six side surfaces.

The compound semiconductor light-emitting device of the present invention has recessed portions in the side direction of the device in at least a portion of the side surfaces of the substrate in the device side surfaces. This increases the surface areas of the side surfaces to improve the efficiency for outwardly transmitting the emitted light. In this invention, the "side direction of the device" stands for a direction of the side constituting the planar shape of the device.

The recessed portions can be formed in the substrate portions of the device side surfaces in the side direction of the device by perforating many small holes in the substrate so as to be corresponded to the separation zones for separating the wafer into individual light-emitting devices, dividing the wafer along the separation zones into individual light-emitting devices. Here, the small holes stand for the holes penetrating through the substrates or the holes (dents) which do not penetrate therethrough.

FIG. 1 is a diagram schematically illustrating a plane of a wafer for producing compound semiconductor light-emitting devices of the present invention, wherein reference numeral 1 denotes light-emitting devices, 2 denotes separation zones and 3 denotes small holes. When the wafer is pushed and cracked along the separation zones 2, the wafer is separated into individual light-emitting devices along the center lines 4 of the separation zones, i.e., along the center lines 4 of the small holes.

Figure 2:
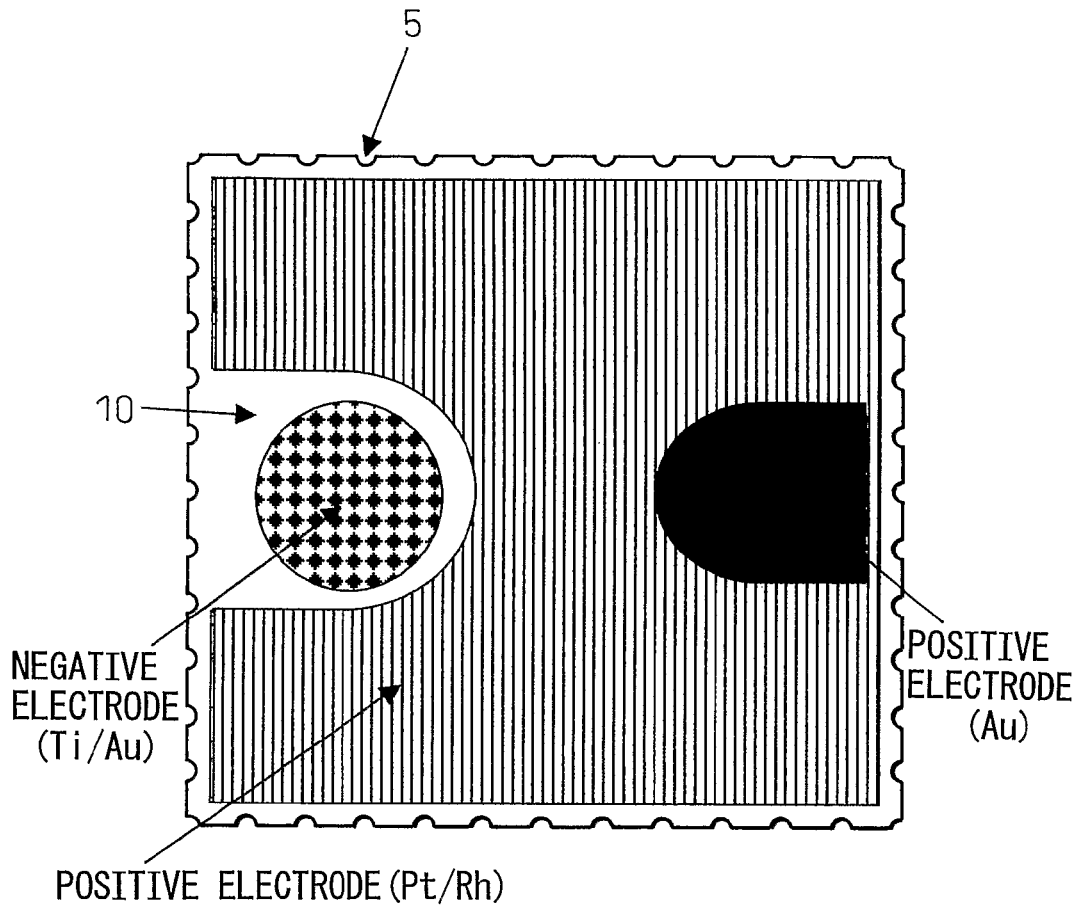
FIG. 2 is a plan view schematically illustrating a compound semiconductor light-emitting device of the invention.
Figure 3:
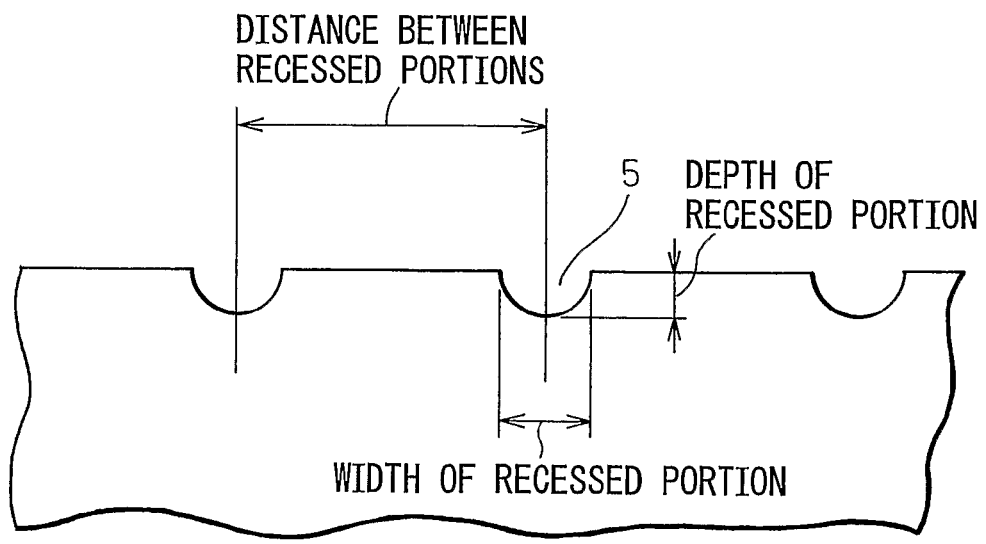
FIG. 3 is a diagram illustrating an upper side portion of FIG. 2 on an enlarged scale.

Referring to FIG. 2 (a plan view schematically illustrating a compound semiconductor light-emitting device of the invention) and FIG. 3 (a diagram illustrating an upper side portion of FIG. 2 on an enlarged scale), the portion in the side surface of the divided light-emitting device, in which the small holes 3 used to exist, constitutes recessed portions 5 on the basis of the center line 4 of the separation zone. With the recessed portions 5 continuously existing in a large number, the side surface of each light-emitting device apparently forms a rugged surface. Any rugged shape can be formed by suitably selecting the shape, size and distance of the small holes. That is, referring to FIG. 3, the distance between the recessed portions 5 is the same as the distance between the small holes 3, the width of the recessed portion 5 is the same as the diameter of the small hole 3, and the depth of the recessed portion 5 is the same as the one-half of the diameter of the small hole 3. In these drawings, reference numeral 10 denotes the surfaces for forming the negative electrodes.

The small holes can be perforated from the front surface of the substrate (from the side of laminating the semiconductor layer) and/or from the back surface thereof. The small holes may be penetrating through the substrate or may be in a dented form. When perforated from the front surface, the small holes may be directly formed from the uppermost portion of the semiconductor layer that is laminated. In this case, the semiconductor multilayer portion, too, becomes rugged to possess an increased surface area further improving the efficiency for outwardly transmitting the emitted light. In particular, the rugged side surfaces surrounding the light-emitting layer are advantageous since they help efficiently scatter the light of a high intensity to the outer side without being absorbed by other layers constituting the semiconductor multilayer structure. It is further allowable to perforate small holes after the semiconductor layer in the separation zones is partly or wholly removed by etching.

The small holes can be perforated by any method that has been known as means for perforating small holes, such as a laser method, an etching method or a mechanical machining method. Among them, the laser method is preferred from the standpoint of machining precision and the machining rate. Hereinafter, the invention will be described in detail with reference to the laser method to which, however, the invention is in no way limited.

A laser machining apparatus of any type can be used in the present invention provided it is capable of perforating small holes in the semiconductor wafer. Concretely, there can be used a CO$_2$ laser, a YAG laser, an excimer laser or a pulse laser. Among them, the pulse laser is preferred.

A laser beam is intermittently irradiated to linearly scan the separation zones, usually, along the center lines thereof. In the region irradiated with the laser beam, the constituent material such as sapphire existing in the region is selectively heated and volatilized to form small holes having roughly a circular shape in horizontal cross section. The laser beam irradiated for volatilizing the constituent material or for transforming the constituent material into a material of a decreased strength is suitably selected for its wavelength depending upon the object to be irradiated. The object to be irradiated is a target (object) to be irradiated with the laser beam. When, for example, the object to be irradiated is silicon, there can be preferably used a neodium ion (Nd$^{3+}$) substituted YAG (yttrium/aluminum/gallium) solid laser having a wavelength of 1.06 μm (see, for example, "Introduction to Medical Laser"

by Uichi Kubo, Jun. 25, 1985, Ohm Publishing Co., First Edition, First Impression, pp. 50-55). When the object to be irradiated is sapphire, a beam of a high energy of a wavelength of not longer than 400 nm is suitable.

When the laser beam is intermittently irradiated, a distance among the irradiated positions becomes the distance (pitch) among the small holes that are perforated. In other words, the distance among the small holes to be perforated is controlled by adjusting the distance for irradiating the laser beam in a direction of scanning the laser beam. If the positions for irradiating the laser beam are varied, the small hole can be perforated maintaining different pitches. In the present invention, however, it is most preferred to periodically perforate the small holes on a straight line maintaining an equal distance (equal pitch). This is because if the small holes of the same size are perforated maintaining an equal distance, then, the device side surfaces having roughly the uniform shape in cross section can be easily formed. In dividing the wafer into individual devices, further, the mechanical pressure can be uniformly exerted to be easily divided into the devices yet forming nearly the uniform side surfaces.

In the case of the pulse laser, the pitch can be adjusted depending upon the frequency and the machining speed.

It is desired that the distance (pitch) among the small holes is not smaller than $1/100$ but is not larger than $1/10$ of the length (width) of the device side surface. For example, in a compound semiconductor LED of a square shape on a plane having side surfaces of a length of 400 μm, it is desired that the small holes are perforated maintaining a distance of not smaller than 4 μm but not larger than 40 μm. In a square LED, the length of a side is the length of the side surface. To periodically perforate the small holes maintaining an equal pitch, it is desired to irradiate the target positions with a laser beam by using a radiating apparatus equipped with a precise "positioning" (precise aligning) function within a range of ±2 μm.

To stably perforate the small holes having openings of a circular shape in cross section, the object must be irradiated with the laser beam through an optical system having a small optical aberration. Irradiation with the laser beam through an optical system generating a large astigmatism or coma often results in the formation of small holes having openings of an elliptic shape. When the direction of the long diameter is not uniform, the wafer is divided into the individual devices having side surfaces with ruggedness of different shapes depending upon the devices that are divided. This makes it difficult to obtain the compound semiconductor light-emitting devices having the same side shapes maintaining a high yield. Namely, due to the formation of device side surfaces of different shapes, there are produced compound semiconductor light-emitting devices having different efficiencies for outwardly transmitting the emitted light, which is not desirable.

When the laser method is employed, the openings of the small holes, usually, assume a nearly circular shape. However, by passing the excimer laser through, for example, a mask having slits of any desired shape, there can be formed openings of a rectangular shape, a trapezoidal shape or a triangular shape in addition to the circular shape.

It is desired that the opening diameter of the small holes (opening diameter on the surface of the object to be irradiated constituting the semiconductor multilayer structure) is not smaller than 1 μm but is not larger than 50 μm irrespective of the length of the device side surfaces. The small holes having a small opening diameter are advantageous for forming the device side surfaces having a fine ruggedness. Holes having an opening diameter of as relatively large as 20 μm to 50 μm are advantageous for constituting a large LED having a side of not smaller than 0.75 mm and, particularly, not smaller than 1 mm. This is because if the laser beam is irradiated over a long distance, i.e., for an extended period of time, even though it may be intermittent, in order to form long device side surfaces of a large LED, then, the object to be irradiated is thermally denaturated and the function that should have been exhibited is not often exhibited to a sufficient degree. When it is intended to form a large LED, therefore, it is advantageous to form the holes having a large opening diameter maintaining a large distance (pitch).

In the LED of a normal size having a side which is 200 μm to 450 μm long, it is desired that the small holes have a diameter of 1 to 20 μm and, preferably, 5 to 15 μm.

The opening diameter of the circular small holes is adjusted by varying the spot diameter of the laser beam. If the spot diameter is increased, there are formed the small holes having a large opening diameter. If the vertical position of the object to be irradiated is shifted back and forth from the focal position, there can be formed small holes having an opening diameter greater than that when irradiated with the laser beam at the focal position. In the case of the object to be irradiated containing an element of the V Group having a high volatility, such as GaAs, indium phosphide (InP) or GaN, in particular, even if the object is irradiated with the laser beam having the same wavelength at a predetermined position, there can be perforated small holes having a larger opening diameter by means of lengthening the time of irradiation.

The two-dimensional shape of the small holes in vertical cross section may be any one of the rectangular shape, trapezoidal shape or triangular shape from the standpoint of forming the device side surfaces of the invention or from the standpoint of dividing the devices. The small holes having openings of a circular shape and a rectangular shape in vertical cross section thereof means that they are three-dimensionally of the shape of a cylinder. The small holes having a trapezoidal shape in vertical cross section means that they are of a conical shape with their tops being cut away. Further, the small holes having a triangular shape in vertical cross section means that they are of a conical shape.

The depth of the small holes that are not penetrating through is controlled by adjusting the optical power of the laser beam. The depth of the small holes increases with an increase in the power of the laser beam with which the object is irradiated. When the object is irradiated with the laser beam while maintaining the power constant, the depth of the small holes can be increased with an increase in the irradiation time. However, if the irradiation time of the laser beam is simply extended to perforate the small holes, then, the opening diameter expands, which is not desirable. Therefore, the power of the laser beam used for perforating the small holes must be adjusted to lie in a range in which the opening diameter is not undesirably expanded while obtaining a desired depth.

The region having ruggedness formed on the side surfaces of the substrate increases with an increase in the depth of the small holes. Therefore, if the depth of the small holes is too small, the region forming ruggedness decreases. If the small holes are formed having a depth in excess of a preferred range, on the other hand, the substrate exhibits a decreased resistance against the mechanical shocks. Therefore, the substrate tends to be spontaneously cracked in the directions different from a direction in which the small holes are arranged. If the substrate spontaneously cracks in a direction in which the small holes have not been perforated, e.g., cracks along the cleaving direction, the side surfaces become flat planes since there have been perforated no small holes for forming ruggedness. Therefore, the surface areas cannot be increased and the efficiency cannot be improved for outwardly transmitting the emitted light, which is not desirable.

It is desired that the depth of the small holes perforated in the substrate is not smaller than 1/10 but is not larger than 3/4 of the total thickness of the substrate. More preferably, the depth is not smaller than 1/5 but is not larger than 1/2 thereof. In the sapphire substrate having a total thickness of, for example, 100 μm, it is desired that the depth of the small holes is not smaller than 20 μm but is not larger than 50 μm.

The small holes can be perforated from the front surface of the substrate (from the side of the semiconductor multilayer) and/or from the back surface. When perforated from the front surface, the small holes are directly formed from the uppermost part of the semiconductor layer that is laminated. It is further allowable to perforate the small holes after the semiconductor layer in the separation zones has been partly or wholly removed by etching. It is desired to use the resist (mask) for etching with which the side surfaces of the semiconductor layer assumes the rugged shape along the small holes.

The interiors of the small holes form cavities without the constituent material. Therefore, if a mechanical pressure is exerted on the linear region provided with the small holes, the wafer can be easily divided. If small holes are perforated in both the front surface and the back surface of the substrate, the devices can be divided more easily. For example, the front surface of the semiconductor multilayer structure is regularly and periodically perforated maintaining a predetermined distance to form small holes on the front surface side of the substrate, and small holes are further perforated from the side of the back surface of the substrate maintaining the same period as that of on the front surface side with their centers in agreement with the centers of the small holes on the front surface side. According to the method of perforating the small holes from both the front surface side of the semiconductor multilayer structure and the back surface side of the substrate as described above, the wafer can be easily divided into the individual light-emitting devices (chips) upon the application of a mechanical pressure to equally divide the small holes into two.

In perforating the small holes for forming ruggedness for division from both the front surface and the back surface of the substrate, it is desired that the small holes perforated on either side have the same opening shape and the same diameter. The depth of the small holes is regarded in terms of the sum of the depth of the small holes in the front surface and the depth of the small holes in the back surface.

It is further allowable to perforate the small holes by the irradiation with the laser beam from either the front surface side of the substrate or from the back surface side thereof. To perforate the small holes having a certain degree of depth in the substrate penetrating through the semiconductor multilayer on the substrate, the laser beam must be irradiated for an extended period of time. Therefore, the opening diameter of the small holes are often undesirably expanded making it difficult to form a desired rugged shape. In such a case, it is preferable that the semiconductor multilayer on the separation zones is partly or wholly removed by etching.

Even when the small holes are perforated from the back surface side only of the substrate, the semiconductor multilayer on the separation zones is better partly or wholly removed by etching to prevent the occurrence of defective division.

Further, upon adjusting the laser beam to be focused inside the substrate, small cavities (or denaturated portions) can be formed in the substrate. Thus, small cavities may be formed in the substrate instead of forming small holes in the front surface (back surface) of the substrate.

In this embodiment, the wafer is divided into the individual light-emitting devices roughly along the center line of the small holes periodically formed along the straight line. For example, the small holes are vertically divided roughly along the centers thereof in a manner that the cylindrical small holes having circular openings are divided into two. Accordingly, the wafer is divided and, at the same time, there are provided light-emitting devices having side surfaces with semi-cylindrical intersticies. Upon cutting the wafer so as to divide the small holes having circular or elliptic openings into two, there is obtained a planar cross section with vertical and periodic ruggedness which is undulating. The distance among the small holes becomes the distance among the heads of waves undulating on a plane. If the small holes are provided in many number by decreasing the diameter of the small holes, the distance can be shortened among the heads of waves, and the cross section of a predetermined length can be provided with an increased number of undulations to increase the surface area thereof.

Cylindrical small holes having openings of a circular shape are divided into two to form "undulation" of the shape of semicircles on a plane in order to form device side surfaces having a surface area which is a maximum of $\pi \times L/2$ ($\pi$=pi) times as great as the plane side surface of the length of L. The efficiency for outwardly transmitting the emitted light increases depending upon the number of the side surfaces having an "undulation" surrounding the device. If the "undulation" is formed on all sides surrounding the device, i.e., the four sides of the LED having a square shape on a plane, there can be constituted a compound semiconductor light-emitting device surrounded by the four side surfaces having an "undulation" to increase the surface areas. By forming the side surfaces having increased surface areas by providing an "undulation" surrounding the device, there can be constituted a compound semiconductor light-emitting device having an increased efficiency for outwardly transmitting the emitted light.

After the small holes are perforated, further, there may be provided a conventional scribe line having a width smaller than the diameter of the small holes and having a depth smaller than the depth of the small holes along the center line of the small holes. This improves the percent defective at the time of dividing the wafer into the individual light-emitting devices. The conventional scribe line can be provided by using a diamond needle, by dicing or by using a laser beam.

A lamp can be obtained by providing the compound semiconductor light-emitting device of the present invention with lead wires and with a cover having a fluorescent body relying upon customary means. The lamp can be used as a source of light for signals.

EXAMPLES

The invention will be described in further detail by way of Examples to which only, however, the invention is in no way limited.

Example 1

A blue light-emitting device comprising a gallium nitride compound semiconductor was fabricated in a manner as described below.

An underlying layer of undoped GaN having a thickness of 2 μm, an n-type contact layer of Si-doped (concentration of $1 \times 10^{19}/cm^3$) GaN having a thickness of 2 μm, an n-type clad layer of Si-doped (concentration of $1 \times 10^{18}/cm^3$) $In_{0.1}Ga_{0.9}N$, a light-emitting layer of a multiple quantum well structure in which a barrier layer of GaN having a thickness of 16 nm and a well layer of $In_{0.2}Ga_{0.8}N$ having a thickness of 2.5 nm were alternately laminated five times and finally the barrier layer was laminated, a p-type clad layer of Mg-doped (concentration of $1 \times 10^{20}/cm^3$) $Al_{0.07}Ga_{0.93}N$ having a thickness of 2.5 nm, and a p-type contact layer of Mg-doped (concentration of $8 \times 10^{19}/cm^3$) GaN having a thickness of 0.15 μm were successively laminated on a sapphire substrate wafer via a buffer layer of AlN to obtain a compound semiconductor laminate.

On a predetermined position of the p-type contact layer of the compound semiconductor laminate, there was formed a reflective positive electrode having a structure of a laminate of Pt, Rh and Au in this order from the side of the p-type contact layer relying upon a known photolithography technology and a lift-off technology.

Next, separation zones were formed, by etching, at a pitch of 350 μm, a width of 20 μm and a depth of 1 μm as shown in FIG. 1 by a known photolithography technology and a reactive ion etching technology. At the same time, the semiconductor wafer was semicircularly etched at positions facing the separation zones and the n-type contact layer was exposed to form the negative electrode-forming surfaces (10) as shown in FIG. 1. Next, the negative electrode of the Ti/Au two-layer structure was formed on the negative electrode-forming surfaces by a known method.

The thus obtained semiconductor wafer was lapped and polished on the back surface side of the sapphire substrates to decrease the thickness down to 80 μm. Further, the back surface of the substrate was uniformly polished like a mirror surface, such that the separation zones could be easily confirmed from the back surface of the sapphire substrate.

Next, the obtained semiconductor wafer was stuck onto the table of a pulse laser working machine and was fixed thereto by using a vacuum chuck. The table was of a structure that could be moved in the X-axis (right-and-left) and Y-axis (up-and-down) directions and that could be turned with the θ-axis as an axis of rotation. After being fixed, the semiconductor wafer was irradiated with a laser beam from the back surface side of the sapphire substrates to perforate small holes of a diameter of 10 μm and a depth of 20 μm having a circular shape in cross section along the center lines of the separation zones maintaining a distance of 25 μm. The laser beam possessed a wavelength of 355 nm and the focal point possessed a spot diameter of 8 μφ. The focal position was adjusted above the surfaces of the sapphire substrates so that the small holes possessed a diameter of 10 μm.

After the small holes have been formed, the vacuum chuck was released, the wafer was peeled off the table and was pushed and divided from the front surface side of the substrates to obtain many square chips having a side of 350 μm from a wafer of 52 mmφ. After being divided, the device side surfaces were observed to possess rugged surfaces on the substrate portion having recessed portions of a depth of about 5 μm and a width of about 10 μm maintaining a distance of 25 μm.

The light-emitting device produced a light-emitting output of 10 mW at a current of 20 mA in a state of being mounted as a bare chip as measured by an integrated sphere method.

Comparative Example 1

A light-emitting device was fabricated in the same manner as in Example 1 but forming a conventional cutting line having a width of 10 μm and a depth of 20 μm by the irradiation with a laser beam instead of forming small holes in the back surfaces of the sapphire substrates along the separation zones by the irradiation with a laser beam. Fine ruggedness was formed in the side surfaces of the obtained light-emitting devices in the portions irradiated with the laser beam. However, the side surfaces were very flat as a whole.

The light-emitting device produced a light-emitting output of 9.5 mW at a current of 20 mA, which was lower by about 5% than that of Example 1.

Example 2

In this embodiment, a light-emitting device was produced in the same manner as in Example 1 but by perforating small holes in the separation zones that are formed by etching on the front surface side of the substrates instead of perforating small holes on the back surface side of the substrates. Here, however, a resist protection film was applied onto the surfaces of the semiconductor prior to perforating the small holes with the laser beam. After the small holes had been perforated, the protection film was removed by washing together with the debris on the protection film.

The side surfaces of the obtained light-emitting device inclusive of the semiconductor portion were rugged surfaces having recessed portions of a depth of about 5 μm and a width of about 10 μm maintaining a distance of 25 μm.

The light-emitting device produced a light-emitting output of 10.2 mW at a current of 20 mA.

Comparative Example 2

A light-emitting device was fabricated in the same manner as in Example 2 except that the small holes in the separation zone had a depth of about 3.5 μm and a conventional cutting line was formed in the back surface of the sapphire substrate in the same manner as in Comparative Example 1.

Only the semiconductor portion of side surface of the obtained light-emitting device was rugged surface having recessed portions of a depth of about 5 μm and a width of about 10 μm maintaining a distance of 25 μm. The obtained light-emitting device produced a light-emitting output of 9.7 mW at a current of 20 mA, which was lower by about 5% than that of Example 2.

Example 3

In this Example, the small holes were perforated from the front surface side of the substrate in the same manner as in Example 2. Thereafter, the small holes were perforated in the back surface of the substrate at positions corresponding to the above small holes. Here, the depths of the small holes were 10 μm on the front surface side and 15 μm on the back surface side.

The side surfaces of the obtained light-emitting device inclusive of the semiconductor portion were rugged surfaces having recessed portions of a depth of about 5 μm and a width of about 10 μm maintaining a distance of 25 μm.

The light-emitting device produced a light-emitting output of 10.2 mW at a current of 20 mA.

Example 4

In this Example, the small holes were perforated in the back surface of the substrates in quite the same manner as in Example 1. Thereafter, a conventional scribe line having a width of 2 μm and a depth of 10 μm was formed by using a diamond needle so as to divide the small holes into two in a semicircular shape. After the scribe line was formed, the wafer was pushed and divided from the front surface side of the substrates to obtain many square chips of a side of 350 μm from the wafer of 52 mmφ. The percent defective was improved as compared to that of Example 1.

The substrate portions on the side surfaces of the obtained light-emitting device were rugged surfaces having recessed portions of a depth of about 5 μm and a width of about 10 μm maintaining a distance of 25 μm in the same manner as in Example 1.

The light-emitting device produced a light-emitting output of 10 mW at a current of 20 mA.

Example 5

In this Example, a light-emitting device was produced in the same manner as in Example 1 but by irradiation with a laser beam while setting the focal position of the laser beam 20 μm inside from the back surface of the substrate, setting the spot diameter to be 1 μm and maintaining a distance of 5 μm.

After being divided, the light-emitting device was observed to be forming ruggedness near the focal point of the laser beam in the side direction. The light-emitting device produced a light-emitting output of 9.8 mW at a current of 20 mA.

INDUSTRIAL APPLICABILITY

The compound semiconductor light-emitting device of the invention features a very high efficiency for outwardly transmitting the emitted light, and offers a very great industrial value when it is used as an LED and as a lamp utilizing the LED.

The invention claimed is:

1. A compound semiconductor light-emitting device comprising:
    a substrate having an upper surface, a lower surface, and a plurality of device side surfaces; and
    a light-emitting layer grown on the upper surface of said substrate,
    wherein at least one of the device side surfaces has an array of recessed portions, individual ones of the recessed portions extend from the lower surface to the upper surface of the substrate, and individual ones of the recessed portions have a semi-circular shape in cross section parallel to the upper surface of the substrate, and
    wherein the depth of individual ones of the recessed portions is a radius of the semi-circular shape in a direction parallel to the upper surface of the substrate, and the height of individual ones of the recessed portions from the lower surface to the upper surface of the substrate is at least 20 μm, and wherein a distance of 4 to 40 μm is maintained between adjacent recessed portions in the array of the recessed portions.

2. A light-emitting device according to claim 1, wherein the light-emitting layer comprises an n-type or p-type compound semiconductor and is of the pn junction type.

3. A light-emitting device according to claim 1, wherein the substrate is selected from the group consisting of a sapphire, a SiC and a III-V Group compound semiconductor single crystal.

4. A light-emitting device according to claim 1, wherein the depth of individual ones of the recessed portions is 0.5 to 10 μm.

5. A light-emitting device according to claim 1, wherein the compound semiconductor light-emitting device is of the flip-chip type.

6. A lamp comprising a compound semiconductor light-emitting device of claim 1.

7. A source of light comprising a lamp of claim 6.

* * * * *